United States Patent
Yagi et al.

(10) Patent No.: US 9,373,608 B2
(45) Date of Patent: Jun. 21, 2016

(54) LIGHT EMITTING DEVICE FOR LINEAR LIGHT SOURCE

(71) Applicant: Nichia Corporation, Anan-shi, Tokushima (JP)

(72) Inventors: Toshiyuki Yagi, Yokohama (JP); Yohei Minoda, Yokohama (JP); Kazunori Watanabe, Yokohama (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/727,592

(22) Filed: Jun. 1, 2015

(65) Prior Publication Data

US 2015/0262988 A1 Sep. 17, 2015

Related U.S. Application Data

(63) Continuation of application No. 13/951,729, filed on Jul. 26, 2013, now Pat. No. 9,076,659.

(30) Foreign Application Priority Data

Jul. 27, 2012 (JP) .................................. 2012-166470
Jul. 25, 2013 (JP) .................................. 2013-154760

(51) Int. Cl.
| | | |
|---|---|---|
| H01L 29/18 | (2006.01) | |
| H01L 25/16 | (2006.01) | |
| H01L 25/04 | (2014.01) | |
| H01L 25/075 | (2006.01) | |
| F21V 5/04 | (2006.01) | |
| H01L 29/866 | (2006.01) | |
| H01L 33/36 | (2010.01) | |
| H01L 33/62 | (2010.01) | |
| F21Y 101/02 | (2006.01) | |

(52) U.S. Cl.
CPC .............. *H01L 25/167* (2013.01); *F21V 5/043* (2013.01); *H01L 25/042* (2013.01); *H01L 25/0753* (2013.01); *H01L 25/165* (2013.01); *H01L 29/866* (2013.01); *H01L 33/36* (2013.01); *H01L 33/62* (2013.01); *F21Y 2101/02* (2013.01); *H01L 2924/0002* (2013.01)

(58) Field of Classification Search
CPC ..................................................... H01L 25/167
USPC ......................................................... 257/88
See application file for complete search history.

(56) References Cited

U.S. PATENT DOCUMENTS

| | | | | |
|---|---|---|---|---|
| 2005/0127816 A1* | 6/2005 | Sumitani | ............. | H01L 25/0753 313/498 |
| 2006/0012967 A1* | 1/2006 | Asai | ......................... | G02B 6/43 361/764 |
| 2011/0133217 A1 | 6/2011 | Hakamata et al. | | |
| 2013/0163244 A1 | 6/2013 | Suzuki | | |

FOREIGN PATENT DOCUMENTS

| | | |
|---|---|---|
| JP | 2003-264267 | 9/2003 |
| JP | 2008-117900 | 5/2008 |

(Continued)

*Primary Examiner* — Ajay K Arora
(74) *Attorney, Agent, or Firm* — Foley & Lardner LLP (57) ABSTRACT

A light emitting device includes a substrate; a first metal film formed on the substrate; a plurality of light emitting elements arranged in a line, each comprising a second metal film on a lower face thereof, each having a quadrilateral outline; and a die bond placed between the first metal film and the second metal films to fix the second metal film on the first metal film. The substrate includes low wettability areas having wettability to the die bond lower than the first metal film. Each of the low wettability areas is disposed between two of the light emitting elements, and each of four sides of the quadrilateral outline is adjacent to the low wettability area different from the low wettability areas adjacent to one of the other three sides.

12 Claims, 9 Drawing Sheets

(56) References Cited

FOREIGN PATENT DOCUMENTS

| JP | 2010-526425 | 7/2010 |
| JP | 2011-216514 | 10/2011 |
| WO | WO 2009/141960 A1 | 11/2009 |

* cited by examiner

LIGHT EMITTING DEVICE FOR LINEAR LIGHT SOURCE

This application is a continuation of U.S. patent application Ser. No. 13/951,729, filed Jul. 26, 2013, which claims priority from Japanese Patent Application Nos. 2012-166470, filed Jul. 27, 2012, and 2013-154760, filed Jul. 25, 2013. The contents of these applications are incorporated herein by reference in their entirety.

BACKGROUND OF THE INVENTION

1. Field of the Invention

The present invention relates to a light emitting device for linear light source, in particular a light emitting device for linear light source including a plurality of light emitting elements that are arranged in a line and fixed by die-bonding.

2. Description of Related Art

A linear light source is a light source that casts a light of a desired wavelength such as visible light or ultraviolet light preferentially on a single line, which is used in many fields such as scanner, ink curing and panel pasting. One of conventional light emitting devices for a linear light source was a light emitting device using an electric discharge tube or the like that can be easily formed into a comparatively slender shape.

To address requirements for higher luminous efficiency and reduction in size and weight, recent light emitting devices for linear light source (hereinafter, sometimes simply referred to as "light emitting devices") include a plurality of light emitting elements such as light emitting diodes arranged in a single line.

For such light emitting devices for linear light source, including a plurality of light emitting elements, what is important is "fine alignment", i.e. the plurality of light emitting elements are arranged in a straight line with high precision, in order that the light is casted on a single line with high efficiency and/or high precision.

An example of good cell alignment methods known in the art can be found in JP 2008-117900A. It discloses a method including the steps of forming low-wettability areas around die pads on which the light emitting elements will be mounted, wherein the low wettability areas have a lower wettability to a die bond for fixing the light emitting elements onto the die pads than a metal film that forms the die pad, and arranging the light emitting elements by self-alignment.

Figure 8:
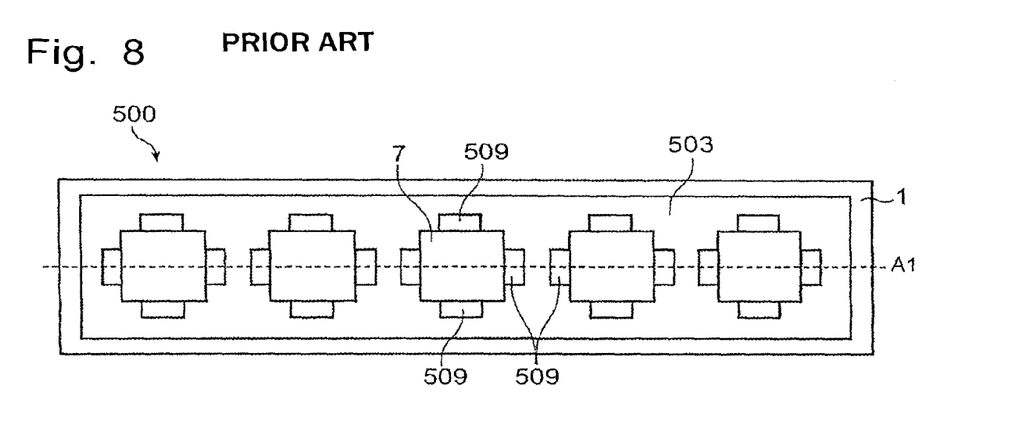
FIG. 8 is a plan view illustrating a conventional light emitting device 500 for linear light source.

A light emitting device 500 as illustrated in FIG. 8 is an example of light emitting devices known in the art that are manufactured with high precision by means of self-alignment.

In the light emitting device 500, a metal film 503 formed on a substrate 1 includes low-wettability areas 509 that are placed adjacent to four side edges (four sides of quadrilateral outlines) of quadrilateral light emitting elements 7 fixed at predetermined positions by die-bonding.

That is, because each light emitting element 7 is accompanied with the low-wettability areas in the neighborhood of each side of its quadrilateral outline, the light emitting elements 7 are arranged such that the centers of the respective quadrilateral outlines are positioned on a line A1 of FIG. 8 and either pair of opposing sides of each quadrilateral outline is positioned parallel to the line A1, which results in a desired alignment with high precision.

By providing an optical element as necessary, such as a cylindrical convex lens extending over the plurality of aligned light emitting elements 7, the light emitting device 500 serves as a linear light source.

However, the conventional light emitting device 500 has a problem that the light intensity on the line A1, on which the light emitting elements 7 are arranged (aligned), decreases periodically along the line A1 to a great degree.

As can be seen in FIG. 8, in the conventional light emitting device 500, the line A1 passes through some of the low-wettability areas 509 that are positioned adjacent to a pair of opposing side edges of each light emitting element V. This makes it impossible to narrow down the distance between the light emitting elements 7 along the line A1. That is, in the light emitting element 500, the distance between the light emitting elements 7 along the line A1 is longer than twice the width of the low-wettability areas 500 (longer than the space enough to place two low-wettability areas 509). As a result, the light intensity along the line A1 decreases at the areas where no light emitting element 7 is laid.

Further, in many cases, the low-wettability areas 509 have considerably lower light reflectance than the metal film 503. The low-wettability areas 509 are often made of non-metal material. For example, they are exposed areas of the substrate 1 where the metal film 503 is not formed. Such material often has considerably lower reflectance than metal.

As a result, the light intensity along the line A1 is further decreased at the areas where the low-wettability areas 509 are laid.

As can be seen from the above, the light intensity measured along the line A1 is periodically decreased corresponding to the areas where the light emitting elements 7 are not mounted.

SUMMARY OF THE INVENTION

The present invention was made in order to ease the above problems. That is, it is an object of the present invention to provide a light emitting device for linear light source that includes a plurality of light emitting elements arranged in a line by die-bonding, and that exhibits low fluctuation of the light intensity in the direction of the alignment.

One embodiment of the present invention is a light emitting device including: a substrate; a first metal film formed on the substrate; a plurality of light emitting elements aligned on a line at an interval $d_1$, that include second metal films on lower faces, and have a quadrilateral outline in a plan view; and a die bond that is placed between the first metal film and the second metal films to fix the second metal films on the first metal film, wherein either diagonal of each of the respective quadrilateral outlines of the plurality of light emitting elements is aligned with the line, and wherein at least one of a distance $D_L$ from a light emitting element on one end among the plurality of light emitting elements arranged on the line to an end of the substrate, and a distance $D_R$ from a light emitting element on the other end among the plurality of light emitting elements arranged on the line to an end of the substrate is equal to or shorter than half the length of the interval $d_1$.

With the present invention, it becomes possible to provide the light emitting device for linear light source that includes a plurality of light emitting elements that are arranged in a line by die-bonding, and that exhibits low fluctuation of the light intensity is small in the direction of the alignment.

DETAILED DESCRIPTION OF THE INVENTION

Embodiments of the present invention will be described in detail below with reference to the accompanying drawings. As used in the following description, terms for indicating a specific direction or position (e.g. "up", "down", "right", "left" and other terms including these terms) are utilized as necessary in efforts to more clearly describe the invention with reference to the drawings, however it is not intended to limit the scope of the present invention by the meaning of these terms. Further, throughout the drawings, identical reference signs designate identical parts or members.

1. First Embodiment

Figure 1:
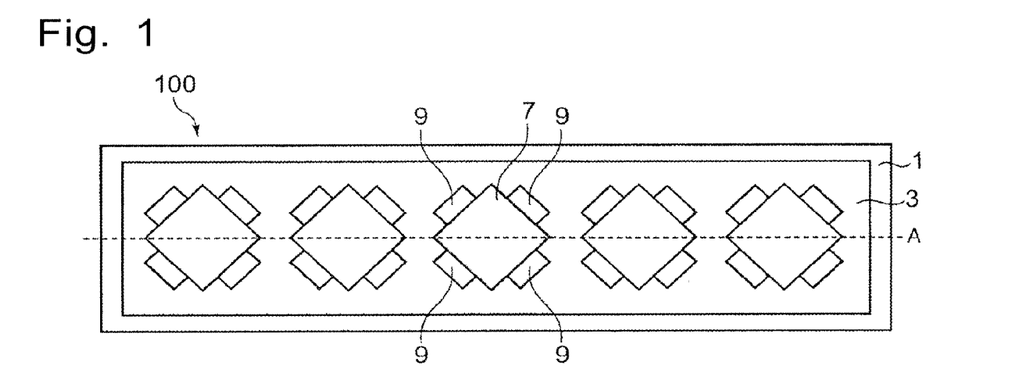
FIG. 1 is a plan view of a light emitting device 100.
Figure 2:
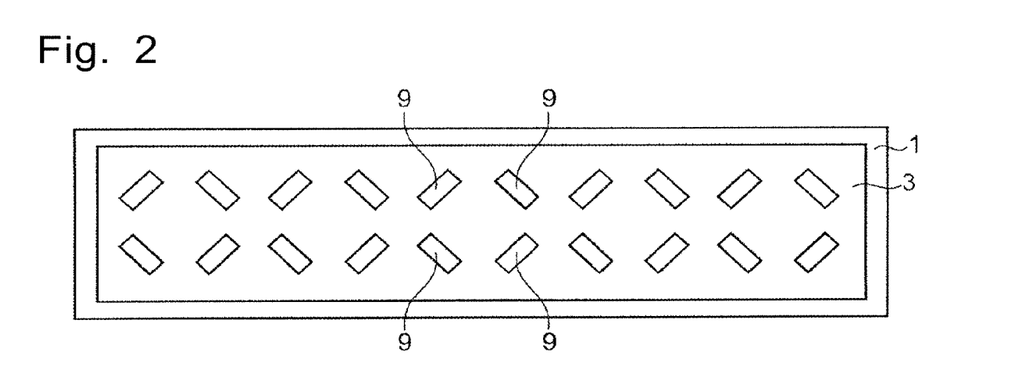
FIG. 2 is a plan view illustrating the positional relationship among a substrate 1, a metal film (first metal film) 3 and low-wettability areas 9 of the light emitting device 100, which corresponds to the state where light emitting elements 7 are removed from the light emitting device 100 of FIG. 1.

FIG. 1 is a plan view of a light emitting device 100 according to the first embodiment of the present invention. FIG. 2 is a plan view illustrating the relationship among a substrate 1, a metal film (first metal film) 3 and a low-wettability areas 9 of the light emitting device 100, which corresponds to the state where light emitting elements 7 are removed from the light emitting device 100 of FIG. 1.

The light emitting device 100 includes the substrate 1, the metal film 3 (also referred to as "die pad") formed on the substrate 1, and the plurality of light emitting elements 7 formed on the metal film 3. On the lower face of each light emitting element 7, a metal film (second metal film) is provided.

A die bond is provided between the metal film 3 and the metal film on the lower face of each light emitting element 7, and the light emitting elements 7 are fixed on the metal film 3 by die-bonding.

In FIG. 1, wires for supplying power to the light emitting elements 7 are omitted. Although an example of wires for supplying power to the light emitting elements 7 is described below, the light emitting elements 7 may be supplied with electric power by any method.

The light emitting elements 7 have a quadrilateral outline (preferably a rectangular, more preferably a square outline) (in a plan view), and each light emitting element 7 is accompanied with the low-wettability areas 9 that are positioned adjacent to each side of its quadrilateral outline.

The low-wettability areas 9 have lower wettability than the metal film 3 with respect to the die bond for fixing the light emitting elements 7 on the metal film 3. With this property, the low-wettability areas 9 allow the light emitting elements 7 to be aligned in a predetermined direction by self-alignment during die-bonding.

The light emitting elements 7 are arranged such that either diagonal of each of the respective quadrilateral outlines is aligned with a single straight line A. In other words, the light emitting elements are arranged such that either pair of opposing apexes (non-adjacent apexes) of each respective quadrilateral outline is positioned on the line A.

As used herein, the phrase "a diagonal line is aligned with the line A" also includes cases where the diagonal line is misaligned by an angle of 5° or less with respect to the line A.

This configuration of the light emitting device 100 can prevent the (periodical) decrease of the light intensity along the line A (also referred to as "emission center line") that passes through the center of each light emitting element 7 in a plan view.

As can be seen in FIG. 1, the low-wettability areas 9 are not formed on the line A of the light emitting device 100 between the light emitting elements 7, which differs from the light emitting device 500 of FIG. 8. Therefore, the distance between the light emitting elements 7 along the line A can be narrowed more easily than the distance between the light emitting elements 7 along the line A1 of the light emitting device 500. Actually, the distance between the light emitting elements 7 of the light emitting device 100 of FIG. 1 is shorter than the distance between the light emitting elements 7 of the light emitting device 500 of FIG. 8.

Further, as can be seen from FIG. 1, the distance between the light emitting elements 7 can be further narrowed in the light emitting device 100, for example by bringing the apexes of adjacent light emitting elements 7 closer to each other.

As described above, because the width of the areas along the line A where the light emitting elements 7 are not placed can be narrowed, the fluctuation (periodical decrease) of the light intensity along the line A can be reduced.

As is described in detail below, even if the low-wettability areas 9 are exposed portions of the surface of the substrate 1 where the metal film 3 is not formed, i.e. even if the low-wettability areas 9 have lower reflectance than the metal film 3, the fluctuation (periodical decrease) of the light intensity can be reduced because the low-wettability areas 9 are not formed on the line A.

The low-wettability areas 9 will be described in detail below.

As used herein, the phrase "having low wettability to the die bond" means that a material has large contact angle with the die bond. Here, the term "contact angle" denotes a value measured by a sessile drop method at a temperature 40° C. to 50° C. higher than the melting point of the actual die bond used (see "Wettability of graphite to fused magnesium", Light Metal Vol. 55, No. 7 (2005), pp. 310-314 for more detail).

Accordingly, the sentence "The low-wettability areas 9 have lower wettability to the die bond than the metal film 3" means that the metal film 3 exhibits a lower value than the low-wettability areas 9 when their contact angles with the die bond are measured by a sessile drop method at a temperature 40° C. to 50° C. higher than the melting point of the die bond.

The contact angle of the low-wettability areas 9 with the die bond is preferably at least 10°, more preferably 10° to 30° larger than the contact angle of the metal film 3 with the die bond.

The low-wettability areas 9 may be made of any material of any state. For example, the low-wettability areas 9 may be made of film that is formed on the metal film 3 (i.e. on the substrate 1 via the metal film 3), or film that is formed on the areas of the substrate 1 where the metal film is not formed (e.g. film that is directly formed on the substrate 1). It is however preferred that the low-wettability areas 9 are formed by partially exposing the substrate 1 that is provided under the metal film 3, because such low-wettability areas can be easily formed.

Figure 5A:
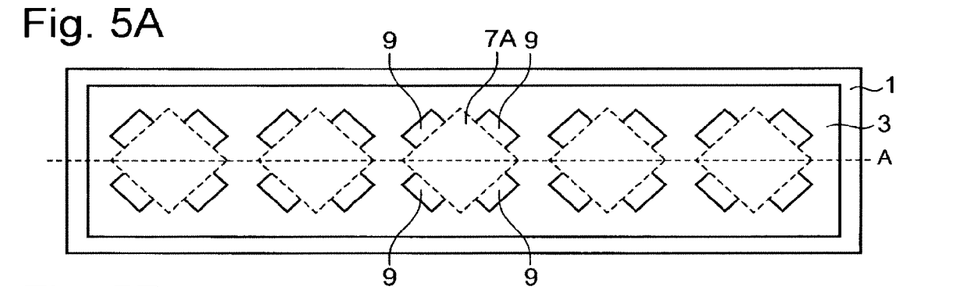
FIG. 5A is a plan view illustrating the positional relationship between mount positions 7A for the light emitting elements are placed and the low-wettability areas 9 of the light emitting device 100.

FIG. 5A is a plan view showing the positional relationship between mount positions 7A where the light emitting elements are to be placed (i.e. positions to which the light emitting elements 7 are placed by self-alignment) and the low-wettability areas 9 of the light emitting device 100.

The low-wettability areas 9 are placed adjacent to at least a part of each side of the quadrilateral outlines of the mount positions 7A for the light emitting elements (i.e. the quadrilateral outlines of the light emitting elements 7). With this arrangement, the light emitting elements 7 are mounted at correct positions by self-alignment.

As illustrated in FIG. 5A, it is preferred that the periphery of each low-wettability area 9 is partially adjacent to (or overlapped with) at least a part of a side of the quadrilateral outlines of the mount positions 7A for the light emitting elements. This configuration can improve the accuracy of positioning the light emitting elements 7 by self-alignment.

Further, it is preferred that a pair of opposing sides of the quadrilateral outlines of mount positions 7A for the light emitting elements is adjacent to the low-wettability areas 9 having the same shape. It is also preferred that these low-wettability areas 9 having the same shape that are placed on each pair of opposing sides are symmetrical to each other about each center point or line passing through the center point of the quadrilateral outlines of the mount positions 7A for the light emitting elements (i.e. self-aligned light emitting elements 7). This configuration can improve the accuracy of adjusting the position and angle of the light emitting elements 7 by self-alignment.

It is also preferred that four sides of a quadrilateral outline of the mount positions 7A for the light emitting elements are accompanied with the low-wettability areas 9 having the same shape.

Figure 5B:
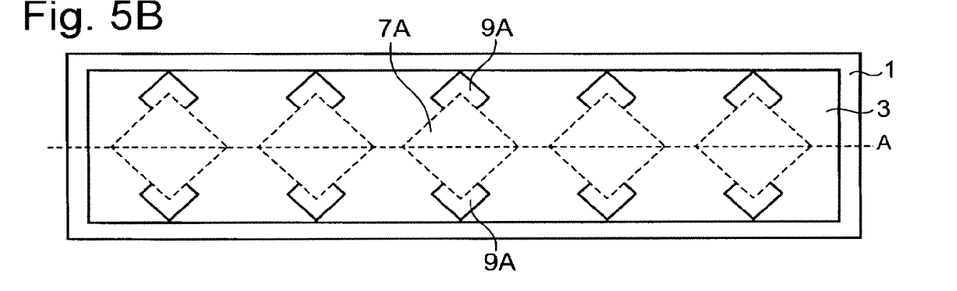
FIG. 5B is a plan view illustrating another preferred example of the arrangement of low-wettability areas.

Besides the above-described example illustrated in FIG. 1, there are a number of preferred arrangements of the low-wettability areas 9. FIG. 5B is a plan view illustrating another preferred example of the arrangement of low-wettability areas.

In the example illustrated in FIG. 5B, the wedge-shaped low-wettability areas 9A are positioned adjacent to either pair of opposing apexes (non-adjacent apexes) of each quadrilateral outline of the mount positions 7A for the light emitting elements. Each low-wettability area 9A is positioned adjacent to two sides of the quadrilateral outline of a mount position 7A for the light emitting element (i.e. a self-aligned light emitting element 7).

It is preferred that the two low-wettability areas 9A adjacent to one mount position 7A for the light emitting element are symmetrical to each other about the center point of the mount position 7A for the light emitting element.

Figure 6A:
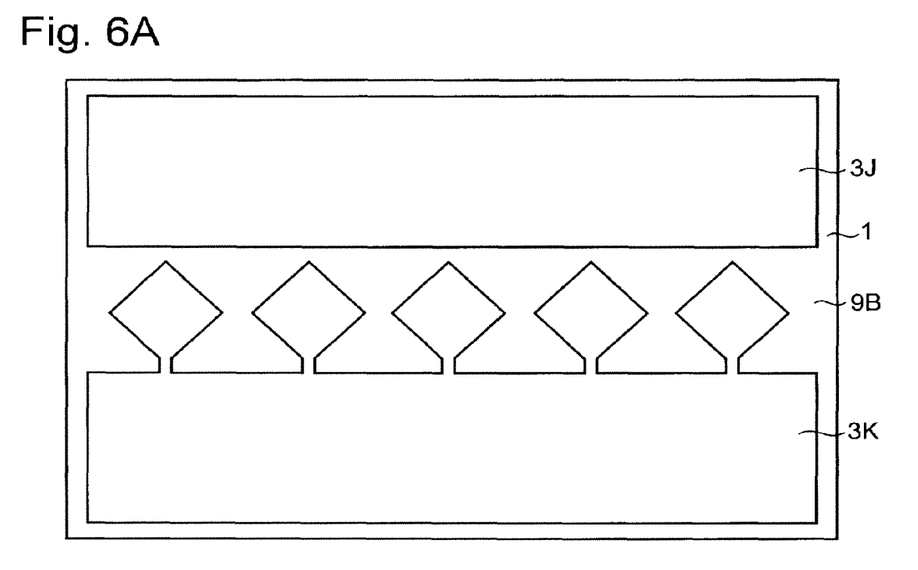
FIG. 6A is a plan view illustrating yet another preferred example of the arrangement of low-wettability areas.
Figure 6B:
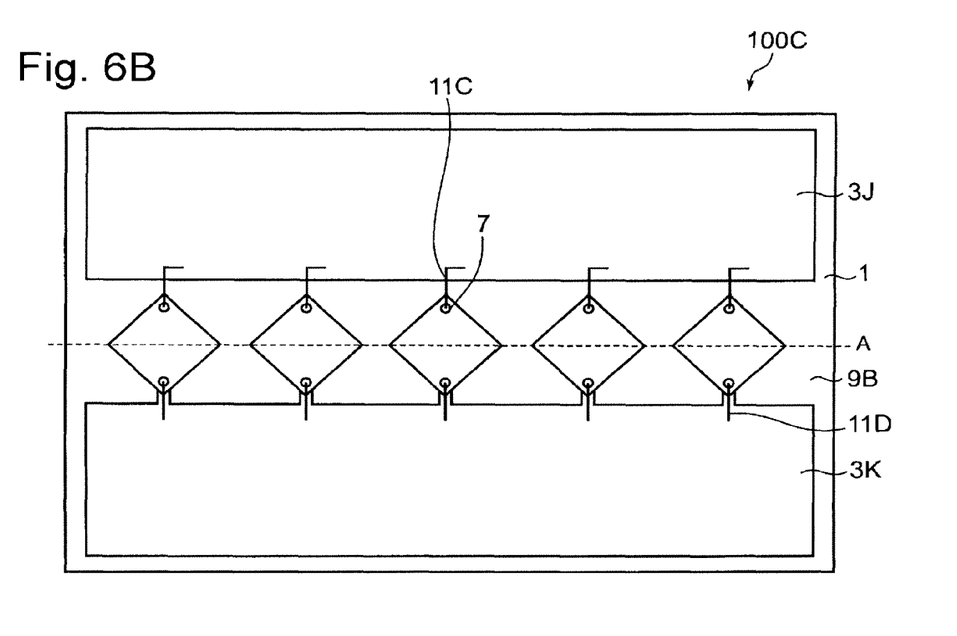
FIG. 6B is a plan view of a light emitting device 100C that employs the low-wettability areas 9B of FIG. 6A.

FIG. 6A is a plan view illustrating another preferred example of the arrangement of a low-wettability area, and FIG. 6B is a plan view of a light emitting device 100C that employs the low-wettability area 9B of FIG. 6A.

In the embodiment illustrated in FIG. 6A, a metal film (first film) 3K on a substrate 1 includes island portions on which light emitting elements 7 are mounted. The island portions have a quadrilateral shape corresponding to the shape of the light emitting elements 7 in a plan view. The island portions of the metal film 3K have narrow parts that connect them to a base portion of the metal film 3K. Except for them, the remaining area is covered with an exposed surface of the substrate 1, which serves as the low-wettability area 9B.

That is, as can be seen in FIG. 6B, the single low-wettability area 9B is placed adjacent to all four sides of the quadrilateral outlines of the light emitting elements 7 of the light emitting device 100C.

Since the island portions of the metal film 3K are nearly completely surrounded by the low-wettability area 9B, the accuracy of adjusting the position and angle of the light emitting elements 7 by self-alignment can be further improved by forming the island portions into a shape approximately identical to the shape of the light emitting elements 7 in a plan view.

Next, an example of wires for supplying power to the light emitting elements 7 will be described.

Figure 3:
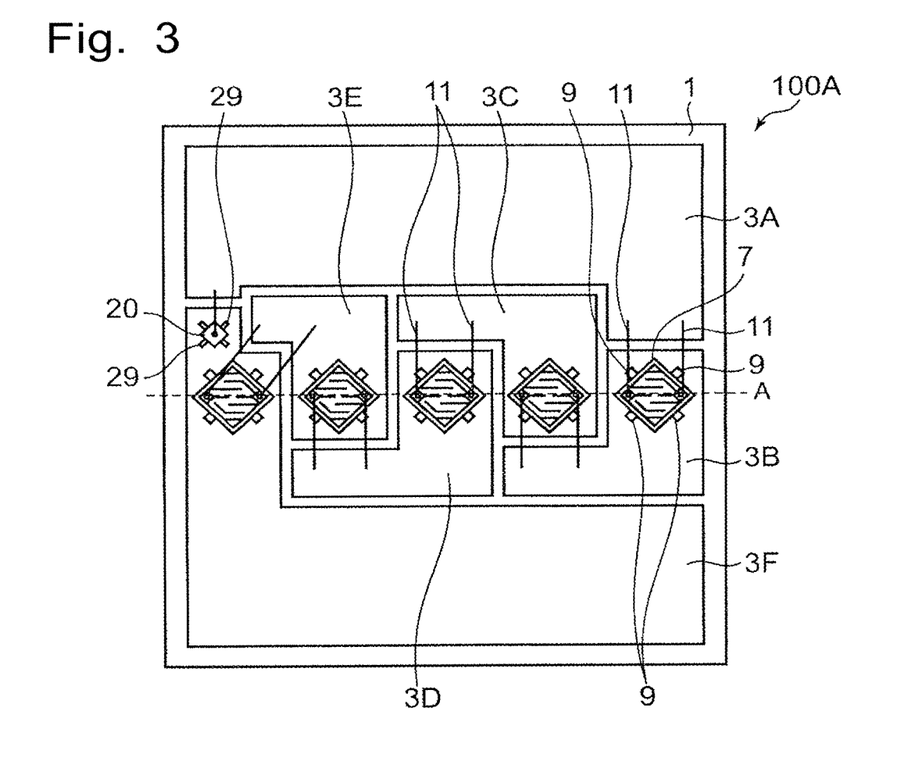
FIG. 3 is a plan view of a light emitting device 100A.

FIG. 3 is a plan view of the light emitting element 100A.

The light emitting device 100A includes separate metal films (first metal films) 3B, 3C, 3D, 3E and 3F instead of the metal film 3 of the light emitting element 100. On each of the metal films 3B, 3C, 3D, 3E and 3F, low-wettability areas 9 similar to those of the light emitting element 100 are formed. On each of the metal films 3B, 3C, 3D, 3E and 3F, a light emitting element 7 is mounted, in which the low-wettability areas 9 adjust its position and angle such that one of the diagonal lines corresponds to the line A.

Each light emitting element 7 of the light emitting device 100A includes one of positive and negative electrodes on its upper face and a metal film (second metal film) on its lower face that serves as the other of the positive and negative electrodes.

On the substrate 1, a third metal film 3A having no light emitting element mounted thereon is formed. The third metal film 3A serves as an electrode for supplying power to the light emitting elements 7.

As illustrated in FIG. 3, the light emitting element 7 mounted on the metal film 3B is electrically connected to the metal film 3A by a bonding wire 11, and is also electrically connected to the metal film 3B via the metal film (electrode) on its lower face.

Similarly, each of the light emitting elements 7 mounted on the metal films 3B to 3F is electrically connected to the next metal film on the right by the bonding wires 11, and is also electrically connected to its mounted metal film via the metal film on its lower face.

FIG. 3 shows merely an example of the arrangement of the bonding wires, and the configuration of the bonding wires 11 on the upper faces of the light emitting elements 7, such as number and position, may be suitably changed.

FIG. 3 illustrates the light emitting elements 7 in detail, down to their electrode pattern formed thereon, however it shows merely an example of the electrode pattern, and any electrode pattern may be provided.

Accordingly, all light emitting elements 7 in FIG. 3 are electrically connected in series to each other. By applying a voltage to the metal film 3A and the metal film 3D as positive and negative terminals or vice versa, the light emitting elements 7 emit light. Further, the light emitting device 100A may be provided with a Zener diode 20 as necessary. If the Zener diode 20 is provided, the low-wettability areas 29 may be placed adjacent to all four sides of its quadrilateral outline.

Further, a polarity marking and/or a case temperature point may be provided on the substrate 1 as necessary.

Figure 4:
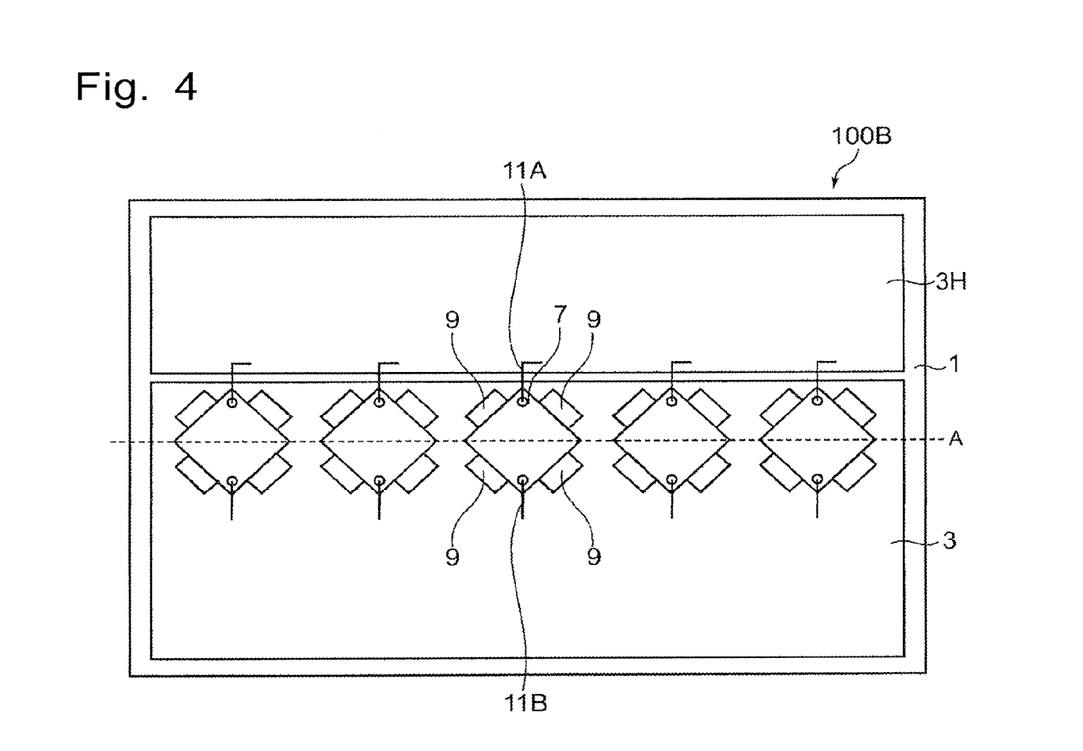
FIG. 4 is a plan view of a light emitting device 100B.

FIG. 4 is a plan view of a light emitting device 100B.

In the light emitting device 100B includes a metal film 3 formed on a substrate 1, low-wettability areas 9 formed in the same manner as the light emitting element 100, and light emitting elements 7 mounted thereon.

On the substrate 1 (an area where the metal film 3 is not formed), a third metal film 3H having no light emitting element 7 mounted thereon is also formed. Each light emitting element 7 of the light emitting device 100B include positive and negative terminals that are both formed on the upper face thereof. One of the positive and negative electrodes of each light emitting element 7 of the light emitting device 100B is electrically connected to the third metal film 3H by a bonding wire 11A, and the other of the positive and negative electrodes is electrically connected to the metal film 3 by a bonding wire 11B.

Accordingly, all of the light emitting elements 7 in FIG. 4 are connected in parallel to each other.

The light emitting device 100C illustrated in FIG. 6B also include a third metal film 3J on the substrate 1 having no light emitting element 7 mounted thereon. The light emitting elements 7 of the light emitting device 100C also include positive and negative electrodes that are both formed on the upper face thereof. One of the positive and negative electrodes of each light emitting element 7 of the light emitting device 100C is electrically connected to the third metal film 3H by a bonding wire 11C, and the other of the positive and negative electrodes is electrically connected to the metal film 3 by a bonding wire 110.

Accordingly, all light emitting elements 7 illustrated in FIG. 6B are connected in parallel to each other.

Any of the above-described light emitting devices 100, 100A, 100B and 100C may be provided with an optical member as necessary, such as cylindrical lens extending over the plurality of light emitting elements 7. Also, a sealing resin and/or phosphor may be provided around the light emitting elements 7 as necessary.

The light emitting devices 100, 100A, 100B and 100C may be easily manufactured by the method exemplified below.

On the substrate, the metal film 3 (or the metal films 3B to 3F) and the low-wettability areas 9 (or the low-wettability areas 9A, 9B), and if necessary, the third metal film 3A, 3H or 3J are formed. Thereafter, the die bond and the light emitting elements 7 are placed at predetermined positions on the metal film 3 (or the metal films 3B to 3F), and the die bond is fused by heat and then solidified to fix the light emitting elements 7 on the metal film 3 (or the metal films 3B to 3F) by diebonding. During this step, self-alignment is caused by the presence of low-wettability areas 9 (or the low-wettability areas 9A, 9B) as described above, which allows the light emitting elements 7 to be arranged such that either diagonal of each of the respective quadrilateral outlines is aligned with the line A.

The components of the light emitting devices 100, 100A, 100B and 100C will be described below.

Die Bond

The die bond is made of suitable material such as Sn—Pb-based, Sn—Ag—Cu-based, Au—Sn-based Sn—Zn-based and Su-Cu-based materials.

Au—Sn-based eutectic materials are preferred. In order to improve the wettability or resistance to solder cracking, Bi, In or the like may be added.

Metal Films (First Metal Films) 3 and 3B to 3F

In order to effectively use the light from the light emitting elements 7 by reflecting it, the metal films 3 and 3B to 3F are made of, but not limited to, suitable material that has a reflectance of, for example, approximately 70% or more, preferably approximately 80% or more, more preferably approximately 85% or more, most preferably approximately 90% or more with respect to the light that the light emitting elements 7 emit.

In order to ensure the self-alignment effect, it is preferred that the metal films 3 and 3B to 3F are made of material that has a contact angle with the die bond of approximately 90° or less, more preferably approximately 80° or less, yet more preferably approximately 60° or less or 45° or less.

Also preferred materials are ones having comparatively high mechanical strength, good etching processability or the like. For example, they may be made of a single layer or laminated layers of Al, Ag, Au, Pd or the like. The metal film 3 (or 3B to 3F) may be formed on the substrate 1 by any method known in the art, such as deposition, sputtering and plating.

The metal films (third metal films) 3A, 3H and 3J may also be made of any of the materials and/or formed by any of the methods listed for the metal films 3 and 3B to 3F.

Metal Film Formed on Bottom Face of Light Emitting Element 7 (Second Metal Film)

On the bottom face of each light emitting element, the metal film is formed covering the whole or partial area. It is preferred that the metal film is formed covering the whole area of the bottom face of each light emitting element 7. This configuration can enhance the effect of the self-alignment, since the wettability of the light emitting elements is increased. The metal film formed on each light emitting element 7 has a reflectance of preferably 70% or more, more preferably 80% or more with respect to the light that the light emitting elements 7 emit. The metal films may serve as an electrode of the light emitting elements 7.

The metal film formed on the bottom faces of each light emitting element 7 may be made of a single layer or laminated layers of Al, Ag, Au, Pd or the like for example. The metal film coating may be formed by any method known in the art, such as deposition, sputtering and plating. Further, the metal film formed on the bottom faces of each light emitting element 7 has a contact angle with the die bond of preferably approximately 90° or less, more preferably approximately 80° or less, yet more preferably approximately 60° or less, most preferably approximately 45° or less.

Substrate 1

The substrate 1 is a substrate on which the light emitting elements 7 are mounted and fixed, and may be made of material suitable for ensuring the insulation. Specifically, examples of such materials include ceramics such as $Al_2O_3$ and AlN, plastics such as high-melting nylon, glass and the like. Among them, suitable materials are ones having a contact angle with the die bond of more than 90°, more preferably 100°, 105° or 110° or more. The use of such materials can make the die bond exert its self-alignment effect during die-bonding of the light emitting elements 7 more significantly.

2. Second Embodiment

Figure 7A:
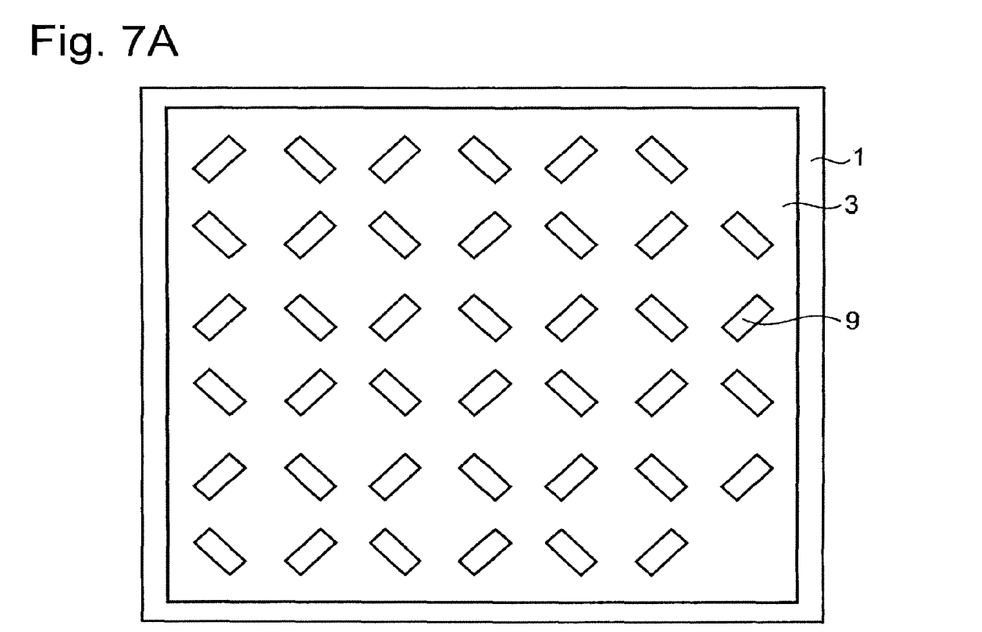
FIG. 7A is a plan view illustrating the arrangement of low-wettability areas 9 according to a second embodiment of the present invention.
Figure 7B:
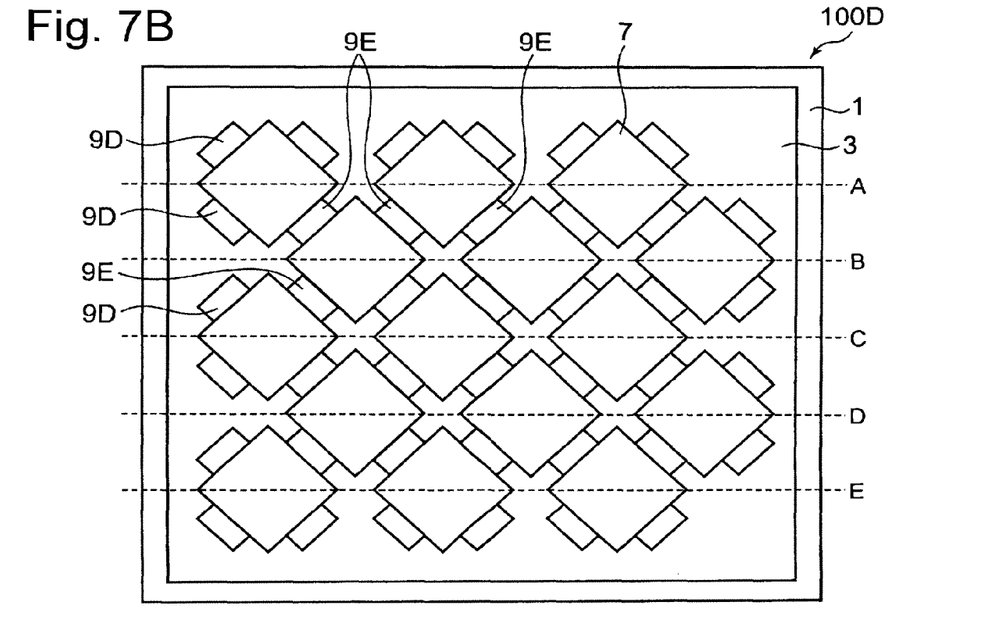
FIG. 7B is a plan view of a light emitting device 100D that employs the low-wettability areas 9 of FIG. 7A.

FIG. 7A is a plan view illustrating the arrangement of low-wettability areas 9 according to the second embodiment of the present invention, and FIG. 7B is a plan view of a light emitting device 100D that employs the low-wettability areas 9 of FIG. 7A.

In the following description, the second embodiment will be described with respect to the difference from the first embodiment. Unless otherwise noted, the second embodiment may employ the above-described configuration of the first embodiment.

The light emitting device 100D include not only a plurality of light emitting elements 7 (three elements in FIG. 7B) arranged such that either diagonal of each of the respective quadrilateral outlines is aligned with a straight line A, but also another plurality of light emitting elements 7 arranged such that either diagonal of each of the respective quadrilateral outlines is aligned with another straight line B.

Similarly, a plurality of light emitting elements 7 are aligned on each of lines C, D and E such that either diagonal of each of the respective quadrilateral outlines is aligned with the line C, D or E.

With this configuration, the light emitting device 100D can provide a plurality of linear light sources.

The low-wettability areas 9 are placed as illustrated in FIG. 7A so that the light emitting elements 7 are arranged at predetermined positions in predetermined directions by self-alignment forming the plurality of linear light sources along the lines A to E.

The arrangement of the low-wettability areas 9 of FIG. 7A is different from one where the arrangement of the low-wettability areas 9 of FIG. 5A is simply duplicated five times in a row (to be precise, the number of the light emitting elements 7 on the respective lines A to E is also changed from 5 to 3).

As illustrated in FIG. 7B, the low-wettability areas 9 are classified into low-wettability areas 9D that are each adjacent to a side of the quadrilateral outline of a light emitting element 7 aligned on one of the lines A to E, and low wettability areas 9E that are each adjacent to both of a side of a quadrilateral outline of a light emitting element 7 aligned along one of the lines A to E and a side of the quadrilateral outline of another light emitting element 7 aligned on another line (a line next to the first line).

Since the low-wettability areas 9E contribute to the self-alignment of two light emitting elements 7 arranged on different lines, the number and total area (sum of the areas of all low-wettability areas 9 on the substrate 1) of low-wettability areas 9 on the substrate 1 can be reduced compared to the case where separate low-wettability areas are individually placed for two light emitting elements.

With this configuration, a higher number of light emitting elements 7 can be mounted on the substrate 1 of the same area, which makes it possible to provide a stronger linear light source.

3. Third Embodiment

Figure 9:
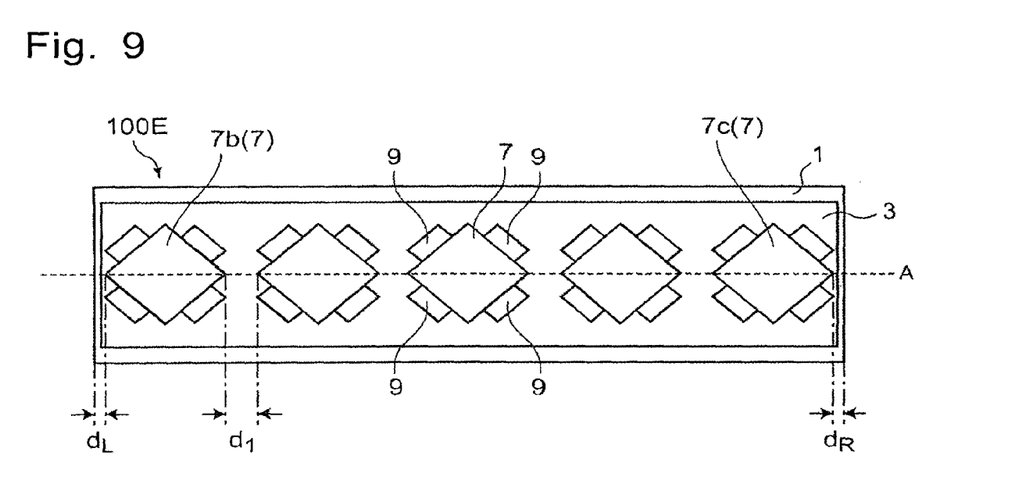
FIG. 9 is a plan view of a light emitting device 100E according to a third embodiment of the present invention.

FIG. 9 is a plan view of a light emitting element 100E according to a third embodiment of the present invention.

In the following description, the third embodiment will be described with respect to the difference from the first and second embodiments. Unless otherwise noted, the third embodiment may employ the above-described configuration of the first or second embodiment.

As with the light emitting device 100, the light emitting device 100E includes light emitting elements 7 arranged such that either diagonal of each of the respective quadrilateral outlines is aligned with a single straight line A (in other words, either pair of opposing (non-adjacent) apexes of each respective quadrilateral outline is positioned on the line A).

Further, the light emitting device 100E includes low-wettability areas 9 of the same shape as those of the light emitting device 100.

In the light emitting device 100E, the plurality of light emitting elements 7 are arranged at regular intervals. At least one of, preferably both of the distance from the light emitting element 7 at one end among the plurality of arranged light emitting elements 7 to an end of the substrate 1, and the distance from the light emitting element 7 at the other end among the plurality of arranged light emitting elements 7 to an end of the substrate 1 is equal to or shorter than half the length of the interval between the light emitting elements 7 (above-described regular interval).

This configuration will be described in more detail with reference to the arrangement of FIG. 9 as an example. In the light emitting device 100E, the plurality of light emitting elements 7 are arranged at regular intervals $d_1$ such that either diagonal of each of the respective quadrilateral outlines is aligned with the line A. Among the plurality of arranged light emitting elements 7, the light emitting element 7b on the far left (one end) is placed at a distance $D_L$ (interval $D_L$) from an end of the substrate 1 (left end (left side) of the substrate 1 in FIG. 9). Similarly, the light emitting element 7c on the far right (the other end) is placed at a distance $D_R$ (interval $D_R$) from an end of the substrate 1 (right end (right side) of the substrate 1 in FIG. 9).

At least one of the distance $D_L$ and distance $D_R$ is equal to or shorter than half the length of the distance $d_1$ (interval $d_1$). It is preferred that both of the distance $D_L$ and distance $D_R$ are equal to or shorter than half the length of the distance $d_1$.

That is, in the light emitting device 100E, at least one of, preferably both of the following expression (1) and expression (2) is (are) satisfied.

$$D_L \leq d_1/2 \quad (1)$$

$$D_R \leq d_1/2 \quad (2)$$

As used herein, the term "distance" or "interval" means the length between two objects at the closest point in a plan view from the direction perpendicular to the substrate as illustrated in FIG. 9 (and FIGS. 10 through 12 described in detail below).

Since one of expressions (1) and (2) is satisfied, if two light emitting devices 100E are arranged such that diagonal lines of the plurality of light emitting elements 7 of both light emitting devices 100E correspond to the same line (i.e. the lines A of the two light emitting devices correspond to each other), the distance between two adjacent light emitting elements 7 across the boundary between the two light emitting devices 100E can be reduced to $d_1$ or less.

For example, if the light emitting devices 100E satisfy expression (1) but not expression (2), two light emitting devices 100E can be arranged such that the light emitting element 7b of one light emitting device 100E is positioned adjacent to the light emitting element 7b of the other light emitting device 100E (i.e. one of the two light emitting devices 100E is positioned as illustrated in FIG. 9, while the other is rotated 180° about an axis perpendicular to the plane of paper to be positioned upside down with respect to the position of FIG. 9). With this configuration, the distance between the two light emitting elements 7b can be reduced to $d_1$ or less.

As a result, it becomes possible to align two light emitting elements 100E to produce a light emitting device that includes more light emitting elements aligned in a longer distance, and that exhibits small fluctuation of the light intensity in the direction of the alignment.

If the light emitting device 100E satisfies both expressions (1) and (2), two or more light emitting devices 100E can be arranged such that diagonal lines of the plurality of light emitting elements 7 of all light emitting devices 100E correspond to the same line (i.e. the lines A of the plurality of light emitting devices 100E correspond to each other). With this configuration, the distance between two adjacent light emitting elements 7 across the boundary between the light emitting devices 100E can be reduced to $d_1$ or less.

In this case, if the light emitting devices are arranged such that the light emitting element 7b of one light emitting device 100E is positioned adjacent to the light emitting element 7c of another light emitting device 100E (i.e. both light emitting devices E are placed as illustrated in FIG. 9), the distance from the light emitting element 7b to the light emitting element 7c can be reduced to $d_1$ or less. Further, by repeating this arrangement as necessary (i.e. yet another light emitting device 100E is placed such that its light emitting element 7c is positioned adjacent to the light emitting element 7b of the another light emitting device 100E, to align the light emitting devices side by side), three or more light emitting devices 100E can be aligned such that the distance between two adjacent light emitting elements 7 across the boundary between two adjacent light emitting devices 100E (distance from the light emitting element 7b to the light emitting element 7c) is reduced to $d_1$ or less.

As a result, it becomes possible to align two or more light emitting devices 100E to produce a light emitting device that includes more light emitting elements aligned in a longer distance and that exhibits small fluctuation of the light intensity in the direction of the alignment.

If the light emitting device 100E include a housing that surround the periphery of the substrate 1, in particular the left and right side faces of the substrate 1 in the plan view of FIG. 9, it is preferred that at least one of the distance from the light emitting element 7b at one end among the plurality of the light emitting elements 7 to an end of the housing, and the distance from the light emitting element 7c at the other end to an end of the housing is equal to or shorter than half the length of the intervals (distance $d_1$) of the light emitting elements 7. It is more preferred both of the distance from the light emitting element 7b at one end to an end of the housing, and the distance from the light emitting element 7c at the other end to an end of the housing are equal to or shorter than half the length of the intervals of the light emitting elements 7.

With this configuration, the advantageous effect of the present embodiment can be achieved with the housing attached.

First Variation

Figure 10:
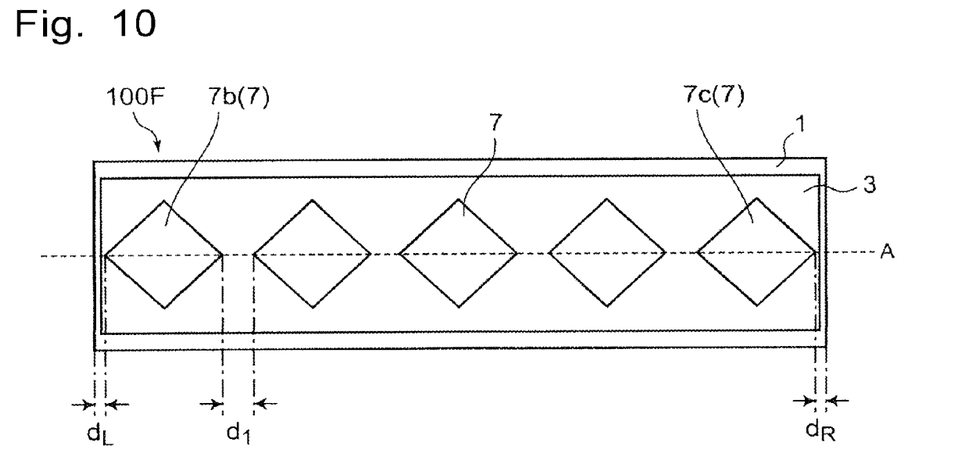
FIG. 10 is a plan view of a light emitting device 100F according to a first variation of the third embodiment.

FIG. 10 is a plan view of a light emitting device 100F according to a first variation of the third embodiment.

The light emitting device 100F differs from the light emitting device 100E in that it does not include the low-wettability areas 9. Except for this, the light emitting device 100F may have the same configuration with the light emitting device 100E.

Because of the absence of low-wettability areas, it is difficult to arrange light emitting elements 7 at predetermined positions by self-alignment.

It is however still possible to arrange the light emitting elements 7 at predetermined positions on the substrate 1, for example by fixing the light emitting elements 7 by a jig during die-bonding to align the light emitting elements 7 with a substrate 1.

Accordingly, the light emitting device 100F can achieve the same advantageous effect as the light emitting device 100E.

Second Variation

Figure 11:
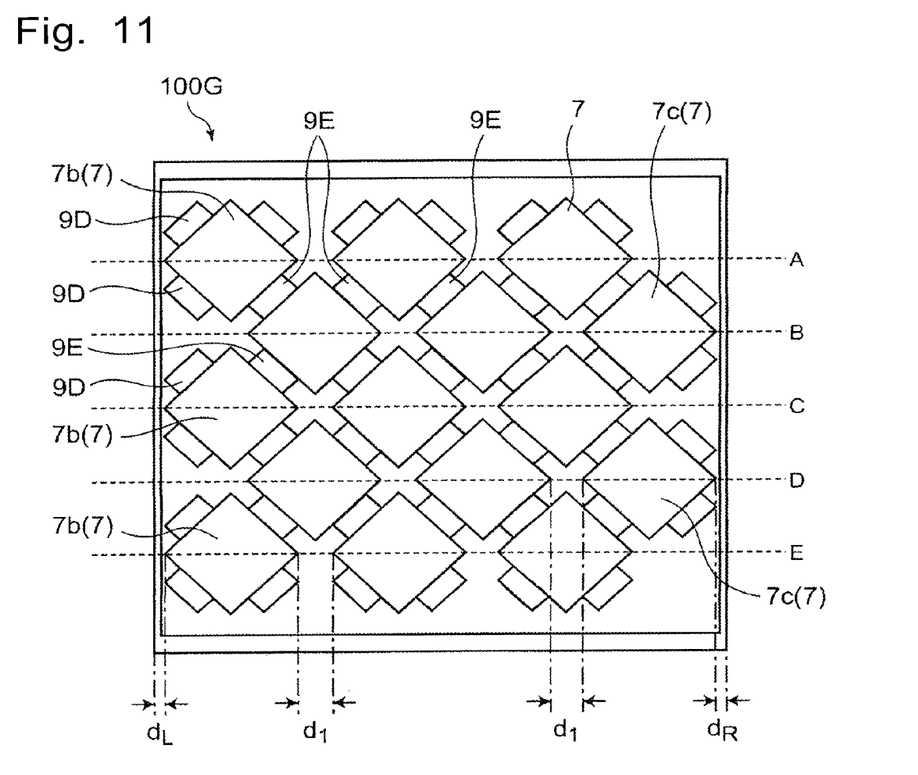
FIG. 11 is a plan view of a light emitting device 100G according to a second variation of the third embodiment.

FIG. 11 is a plan view of a light emitting device 100G according to a second variation of the third embodiment.

As with the light emitting device 100D of the second embodiment, the light emitting device 100G includes a plurality of light emitting elements 7 (three light emitting elements 7 in FIG. 11) arranged such that either diagonal of each of the respective quadrilateral outlines is aligned with a straight line A, as well as another plurality of light emitting elements 7 (three light emitting elements 7 in FIG. 11) arranged such that either diagonal of each of the respective quadrilateral outlines is aligned with another straight line B.

Similarly, the light emitting device 100G further includes a plurality of light emitting elements 7 aligned on each of lines C, D and E such that either diagonal of each of the respective quadrilateral outlines is aligned with the line C, D or E. With this configuration, a plurality of linear light sources can be provided. As a result, the light emitting device 100G can achieve the same effect as the light emitting device 100D.

In the light emitting device 100G, each set of light emitting elements 7 are arranged at regular intervals. With respect to at least one of these plurality of lines, either of the distance from the light emitting element 7 on one end among the plurality of arranged light emitting elements 7 to an end of the substrate 1, and the distance from the light emitting element 7 at the other end to an end of the substrate 1 is equal to or shorter than half the length of the intervals (above-described regular intervals) between the light emitting elements.

In the embodiment illustrated in FIG. 11 for example, among the plurality of light emitting elements 7 arranged such that one of the diagonal lines corresponds to the line A, C or E, the light emitting elements 7b on the far left (one end) are placed at a distance $D_L$ from an end of the substrate 1 (left end (left side) of the substrate 1 in FIG. 11). Among the plurality of light emitting elements 7 arranged such that one of the diagonal lines corresponds to the line B or D, the light emitting elements 7c on the far right (one end) are placed at a distance $D_R$ from an end of the substrate 1 (right end (right side) of the substrate 1 in FIG. 11).

In this embodiment, at least one of, preferably both of the following conditions are fulfilled: i) the distance $D_L$ satisfies expression (1); and ii) the distance $D_R$ satisfies expression (2).

If two light emitting devices 100G having the above-described configuration are aligned, the distance between two light emitting elements 7 across the boundary between the two light emitting device 100 can be reduced to $d_1$ or less with respect to either of the lines A, C and E or the lines B and D.

As a result, it becomes possible to align two light emitting devices 100G to produce a light emitting device that includes more light emitting elements 7 aligned in a longer distance, and that exhibits low fluctuation of the light intensity in the direction of the arrangement.

Third Variation

Figure 12:
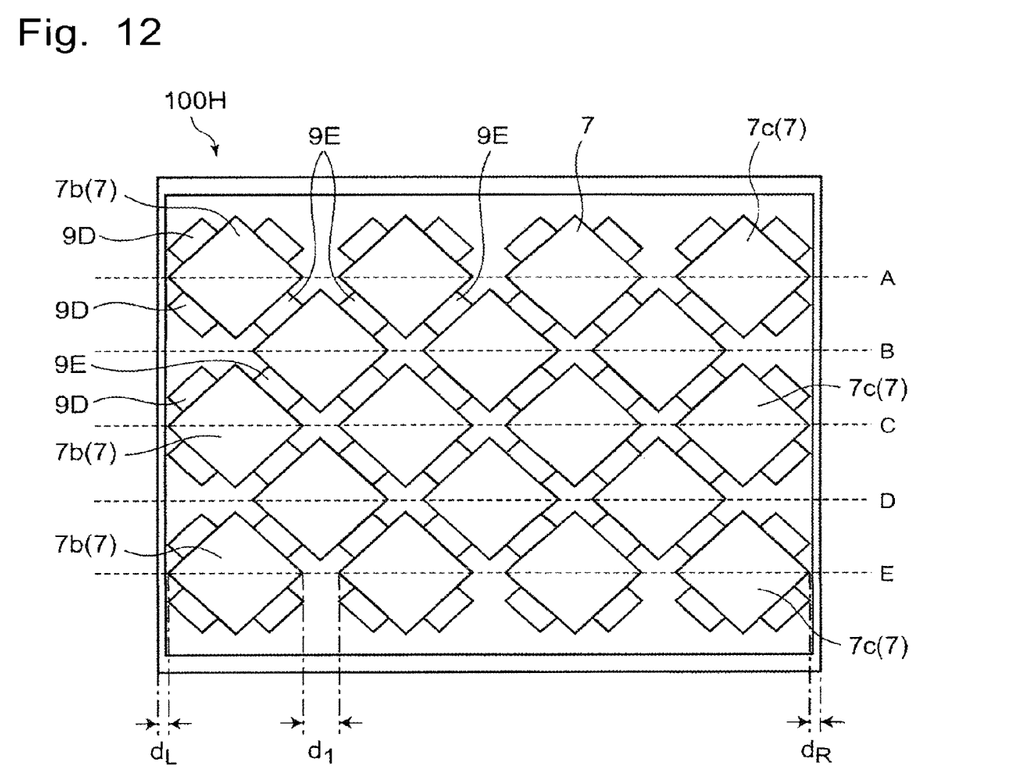
FIG. 12 is a plan view of a light emitting device 100H according to a third variation of the third embodiment.

FIG. 12 is a plan view of a light emitting device 100H according to the third variation of the third embodiment.

The light emitting device 100H is as same as the light emitting device 100G in the point that a plurality of light emitting elements 7 are arranged such that either diagonal of each of the respective quadrilateral outlines is aligned with a straight line A, and another plurality of light emitting elements 7 are arranged similarly such that either diagonal of each of the respective quadrilateral outlines is aligned with each of straight lines B, C, D and E.

However, the number of the light emitting elements 7 on each line alternately changes between n and n+1 by line (where n is an integer of 2 or more), such as n+1 on the line A (4 in FIG. 12), n on the line B (3 in FIG. 12), n+1 on the line C, n on the line D, and n+1 on the line E).

With respect to the lines with n+1 pieces of the light emitting elements 7 (the lines A, C and E in FIG. 12), the light emitting elements 7b on the far left (one end) of the plurality of light emitting elements 7 are placed at a distance of $D_L$ from an end of the substrate 1 (left end (left side) of the substrate 1 in FIG. 12), and the light emitting elements 7c on the far right (the other end) are placed at a distance $D_R$ from an end of the substrate 1 (right end (right side) of the substrate 1 in FIG. 12).

At least one of the distance $D_L$ and distance $D_R$ is equal to or shorter than half the length of the interval $d_1$. It is preferred that both of the distance $D_L$ and distance $D_R$ are equal to or shorter than half the length of the interval $d_1$.

That is, in the light emitting device 100H, at least one of expressions (1) and (2), preferably both of expressions (1) and (2) is (are) satisfied.

As a result, if two light emitting devices 100H are aligned, the distance between adjacent light emitting elements 7 across the boundary between the two light emitting devices 100H can be reduced to $d_1$ or less with respect to the lines A, C and E, which makes it possible to produce a light emitting device that include more light emitting elements aligned in a longer distance, and that exhibits low fluctuation of the light intensity in the direction of the alignment.

If both of the expressions (1) and (2) are satisfied in the light emitting device 100H, three or more light emitting devices 100H can be aligned. In this case, the distance between the adjacent light emitting elements 7 across the boundary between the light emitting devices 100H can be reduced to $d_1$ or less with respect to the lines A, C and E, which makes it possible to produce a light emitting device that include yet more light emitting element aligned in a yet longer distance, and that exhibits low fluctuation of the light intensity in the direction of the alignment.

In the embodiments illustrated in FIGS. 11 and 12, low-wettability areas 9 are provided to fix the light emitting elements 7 at predetermined positions on the substrate 1 by self-alignment. The embodiments are however not limited thereto. As with the light emitting device 100F, the light emitting elements 7 may be placed at predetermined positions on the substrate 1 without low-wettability areas 9.

This application claims the benefit of priority from the prior Japanese Patent Applications Nos. 2012-166470 and 2013-154760 under the Paris Convention, and, thus, the entire contents thereof are incorporated herein by reference.

What is claimed is:

1. A light emitting device, comprising:
   a substrate;
   a first metal film formed on the substrate;
   a plurality of light emitting elements arranged in a line, each comprising a second metal film on a lower face thereof, each having a quadrilateral outline; and
   a die bond placed between the first metal film and the second metal films to fix the second metal film on the first metal film,
   wherein the substrate includes low wettability areas having wettability to the die bond lower than the first metal film, and
   wherein each of the low wettability areas is disposed between two of the light emitting elements, and each of four sides of the quadrilateral outline is adjacent to the low wettability area different from the low wettability areas adjacent to one of the other three sides.

2. The light emitting device according to claim 1, wherein the plurality of light emitting elements include at least three light emitting elements arranged in a line, and
   wherein the low wettability area is disposed between two adjacent light emitting elements among the at least three light emitting elements.

3. The light emitting device according to claim 1, wherein the light emitting element includes one of positive and negative electrodes on an upper face thereof, and the second metal film serves as the other of the positive and negative electrodes.

4. The light emitting device according to claim 1, wherein the light emitting element includes two electrodes on an upper face thereof.

5. The light emitting device according to claim 1, wherein the light emitting element includes a positive electrode and a negative electrode on an upper face thereof.

6. The light emitting device according to claim 1, wherein the substrate includes a third metal film having no light emitting element mounted thereon, and
   wherein the light emitting element is electrically connected to the third metal through a bonding wire.

7. The light emitting device according to claim 1, further comprising a Zener diode having a quadrilateral outline in a plan view, and
   wherein each of four sides of the quadrilateral outline of the Zener diode is adjacent to the low wettability area.

8. The light emitting device according to claim 1, wherein the two of the plurality of light emitting elements adjacent to the low wettability area are substantially parallel to each other.

9. The light emitting device according to claim 1, wherein an optical member is provided over the plurality of light emitting elements.

10. The light emitting device according to claim 9, wherein the optical member is a cylindrical lens.

11. The light emitting device according to claim 1, wherein the plurality of light emitting elements are arranged in lines and rows.

12. The light emitting device according to claim 1, wherein the die bond is made of a material selected from the group consisting of Sn—Pb based material, Sn—Ag—Cu based material, Au—Sn based material, Sn—Zn based material and Su—Cu based material.

* * * * *